(12) United States Patent
Belek

(10) Patent No.: US 7,540,634 B2
(45) Date of Patent: Jun. 2, 2009

(54) HIGH POWER LED ELECTRO-OPTIC ASSEMBLY

(75) Inventor: Ronald E. Belek, Coventry, CT (US)

(73) Assignee: Henkel Corporation, Rocky Hill, CT (US)

( * ) Notice: Subject to any disclaimer, the term of this patent is extended or adjusted under 35 U.S.C. 154(b) by 274 days.

(21) Appl. No.: 11/629,591

(22) PCT Filed: May 13, 2005

(86) PCT No.: PCT/US2005/016900

§ 371 (c)(1),
(2), (4) Date: Dec. 14, 2006

(87) PCT Pub. No.: WO2006/001928

PCT Pub. Date: Jan. 5, 2006

(65) Prior Publication Data

US 2008/0273329 A1    Nov. 6, 2008

Related U.S. Application Data

(60) Provisional application No. 60/579,824, filed on Jun. 15, 2004.

(51) Int. Cl.
*F21V 29/00* (2006.01)
(52) U.S. Cl. .................. 362/294; 362/373; 362/800
(58) Field of Classification Search ............ 362/294, 362/800, 547, 545, 362, 373; 257/98, 712, 257/717–722
See application file for complete search history.

(56) References Cited

U.S. PATENT DOCUMENTS 3,512,027 A * 5/1970 Kupsky ................ 313/499

3,638,013 A    1/1972 Keller
3,712,984 A    1/1973 Lienhard (Continued)

FOREIGN PATENT DOCUMENTS

CA    2190225    6/1997

(Continued)

OTHER PUBLICATIONS

Burgess, John et al., "An Evaluation of Four-curing Units Comapring Soft and Hard Curing," Pract. Periodont. Aesthet. Dent. 11(1), 125-132, 1999.

(Continued)

*Primary Examiner*—Bao Q Truong
(74) *Attorney, Agent, or Firm*—Steven C. Bauman

(57) ABSTRACT

The present invention provides a high power LED electro-optic assembly (40) including conductive heat sink (18) and an LED (14) mounted at one end of the heat sink. The LED (14) is in electrical engagement with the heat sink (18). The assembly (40) also includes a reflector (2) mounted at the other end of the heat sink. An insulating bond material (19) is provided between the reflector and the sink. The assembly (40) further includes a conductive bonding pin (15) extending through the reflector (12) and is in conductive engagement therewith and an electrical engagement (16) which electrically engages the pin (15) to the LED (14). Finally, an electric sleeve assembly (30) where the sleeve (32) is coated with an electrical insulating coating (34) is applied to the LED electro-optic assembly.

28 Claims, 4 Drawing Sheets

U.S. PATENT DOCUMENTS

| | | |
|---|---|---|
| 3,733,481 A | 5/1973 | Kuyt |
| 3,859,536 A * | 1/1975 | Thiel .................... 250/552 |
| 3,868,513 A | 2/1975 | Gonser |
| 3,970,856 A | 7/1976 | Mahaffey et al. |
| 4,048,490 A | 9/1977 | Troue |
| 4,114,274 A | 9/1978 | Jones |
| 4,114,946 A | 9/1978 | Hoffmeister et al. |
| 4,149,086 A | 4/1979 | Nath |
| 4,184,196 A | 1/1980 | Moret et al. |
| 4,185,891 A | 1/1980 | Kaestner |
| 4,186,748 A | 2/1980 | Schlager |
| 4,209,907 A | 7/1980 | Tsukada et al. |
| 4,229,658 A | 10/1980 | Gonser |
| 4,230,453 A | 10/1980 | Reimers |
| 4,233,649 A | 11/1980 | Scheer et al. |
| 4,280,273 A | 7/1981 | Vincent |
| 4,298,806 A | 11/1981 | Herold |
| 4,337,759 A | 7/1982 | Popovich et al. |
| 4,346,329 A | 8/1982 | Schmidt |
| 4,385,344 A | 5/1983 | Gonser |
| 4,391,588 A | 7/1983 | Matsui |
| 4,398,885 A | 8/1983 | Loge et al. |
| 4,412,134 A | 10/1983 | Herold et al. |
| 4,445,858 A | 5/1984 | Johnson |
| 4,450,139 A | 5/1984 | Bussiere et al. |
| 4,610,630 A | 9/1986 | Betush |
| 4,666,406 A | 5/1987 | Kanca, III |
| 4,673,353 A | 6/1987 | Nevin |
| 4,675,785 A | 6/1987 | Young |
| 4,716,296 A | 12/1987 | Bussiere et al. |
| 4,729,076 A | 3/1988 | Masami et al. |
| 4,742,432 A | 5/1988 | Thillays et al. |
| 4,757,381 A | 7/1988 | Cooper et al. |
| 4,791,634 A | 12/1988 | Miyake |
| 4,792,692 A | 12/1988 | Herold et al. |
| 4,810,194 A | 3/1989 | Snedden |
| 4,822,335 A | 4/1989 | Kawai et al. |
| 4,826,431 A | 5/1989 | Fujimura et al. |
| 4,836,782 A | 6/1989 | Gonser |
| 4,839,566 A | 6/1989 | Herold et al. |
| 4,846,546 A | 7/1989 | Cuda |
| 4,888,489 A | 12/1989 | Bryan |
| 4,901,324 A | 2/1990 | Martin |
| 4,935,665 A | 6/1990 | Murata |
| 4,936,808 A | 6/1990 | Lee |
| 4,948,215 A | 8/1990 | Friedman |
| 4,963,798 A | 10/1990 | McDermott |
| 4,999,310 A | 3/1991 | Kim |
| 5,003,434 A | 3/1991 | Gonser et al. |
| 5,007,837 A | 4/1991 | Werly |
| 5,017,140 A | 5/1991 | Ascher |
| 5,029,335 A | 7/1991 | Fisher et al. |
| 5,029,957 A | 7/1991 | Hood |
| 5,046,840 A | 9/1991 | Abbiss et al. |
| 5,070,258 A | 12/1991 | Izumi et al. |
| 5,115,761 A | 5/1992 | Hood |
| 5,147,204 A | 9/1992 | Patten et al. |
| 5,150,016 A | 9/1992 | Sawase et al. |
| 5,160,200 A | 11/1992 | Cheselske |
| 5,161,879 A | 11/1992 | McDermott |
| 5,162,696 A | 11/1992 | Goodrich |
| 5,169,632 A | 12/1992 | Duell et al. |
| 5,173,810 A | 12/1992 | Yamakawa |
| 5,195,102 A | 3/1993 | McLean et al. |
| 5,198,678 A | 3/1993 | Oppawsky |
| 5,201,655 A | 4/1993 | Friedman |
| 5,233,283 A | 8/1993 | Kennedy |
| 5,242,602 A | 9/1993 | Richardson et al. |
| 5,253,260 A | 10/1993 | Palombo |
| 5,265,792 A | 11/1993 | Harrah et al. |
| 5,278,629 A | 1/1994 | Schlager et al. |
| 5,283,425 A | 2/1994 | Imamura |
| 5,290,169 A | 3/1994 | Friedman et al. |
| 5,302,124 A | 4/1994 | Lansing et al. |
| 5,309,457 A | 5/1994 | Minch |
| 5,312,249 A | 5/1994 | Kennedy |
| 5,316,473 A | 5/1994 | Hare |
| 5,328,368 A | 7/1994 | Lansing et al. |
| 5,371,753 A | 12/1994 | Adsett |
| 5,371,826 A | 12/1994 | Friedman |
| 5,373,114 A | 12/1994 | Kondo et al. |
| 5,387,800 A | 2/1995 | Kurtich et al. |
| 5,420,768 A | 5/1995 | Kennedy |
| 5,445,608 A | 8/1995 | Chen et al. |
| 5,457,611 A | 10/1995 | Verderber |
| 5,471,129 A | 11/1995 | Mann |
| 5,474,449 A | 12/1995 | Loge et al. |
| 5,487,662 A | 1/1996 | Kipke et al. |
| 5,504,764 A | 4/1996 | Pohlmann et al. |
| 5,521,392 A | 5/1996 | Kennedy et al. |
| 5,522,225 A | 6/1996 | Eskandari |
| 5,530,632 A | 6/1996 | Shikano et al. |
| 5,535,230 A | 7/1996 | Abe |
| 5,554,855 A | 9/1996 | Ueno |
| 5,616,141 A | 4/1997 | Cipolla |
| 5,617,492 A | 4/1997 | Beach et al. |
| 5,634,711 A | 6/1997 | Kennedy et al. |
| 5,660,461 A | 8/1997 | Ignatius et al. |
| 5,664,042 A | 9/1997 | Kennedy |
| 5,698,866 A | 12/1997 | Doiron et al. |
| 5,707,139 A | 1/1998 | Haitz |
| 5,711,665 A | 1/1998 | Adam et al. |
| 5,747,363 A | 5/1998 | Wei et al. |
| 5,759,032 A | 6/1998 | Bartel |
| 5,762,867 A | 6/1998 | D'Silva |
| 5,800,478 A | 9/1998 | Chen et al. |
| 5,803,729 A | 9/1998 | Tsimerman |
| 5,857,767 A | 1/1999 | Hochstein |
| 5,912,470 A | 6/1999 | Eibofner et al. |
| 5,928,220 A | 7/1999 | Shimoji |
| 5,949,805 A | 9/1999 | Mordaunt et al. |
| 5,975,895 A | 11/1999 | Sullivan |
| 6,008,264 A | 12/1999 | Ostler et al. |
| 6,033,223 A | 3/2000 | Narusawa et al. |
| 6,045,240 A | 4/2000 | Hochstein |
| 6,046,460 A | 4/2000 | Mertins |
| 6,065,965 A | 5/2000 | Rechmann |
| 6,068,474 A | 5/2000 | Senn et al. |
| 6,077,073 A | 6/2000 | Jacob |
| 6,086,367 A | 7/2000 | Levy |
| 6,095,812 A | 8/2000 | Senn et al. |
| 6,102,696 A | 8/2000 | Osterwalder et al. |
| 6,113,212 A | 9/2000 | Ng |
| 6,123,545 A | 9/2000 | Eggler et al. |
| 6,155,823 A | 12/2000 | Nagel |
| 6,159,005 A | 12/2000 | Herold et al. |
| 6,161,937 A | 12/2000 | Rosenstatter |
| 6,168,431 B1 | 1/2001 | Narusawa et al. |
| 6,171,105 B1 | 1/2001 | Sarmadi |
| 6,171,331 B1 | 1/2001 | Bagraev et al. |
| 6,186,786 B1 | 2/2001 | Trushkowsky |
| 6,193,510 B1 | 2/2001 | Tsimerman |
| 6,200,134 B1 | 3/2001 | Kovac et al. |
| 6,208,788 B1 | 3/2001 | Nosov |
| 6,220,722 B1 | 4/2001 | Begemann |
| 6,280,187 B1 | 8/2001 | Slone |
| 6,280,188 B1 | 8/2001 | Ross |
| 6,285,476 B1 | 9/2001 | Carlson et al. |
| 6,331,111 B1 | 12/2001 | Cao |
| 6,345,982 B1 | 2/2002 | Meyer |
| 6,350,041 B1 | 2/2002 | Tarsa et al. |
| 6,371,636 B1 | 4/2002 | Wesson |
| 6,379,149 B1 | 4/2002 | Franetzki |
| 6,398,383 B1 | 6/2002 | Huang |

| | | |
|---|---|---|
| 6,402,347 B1 | 6/2002 | Maas et al. |
| 6,419,483 B1 | 7/2002 | Adam et al. |
| 6,439,888 B1 | 8/2002 | Boutoussov et al. |
| 6,468,077 B1 | 10/2002 | Melikechi et al. |
| 6,492,725 B1 | 12/2002 | Loh et al. |
| 6,511,317 B2 | 1/2003 | Melikechi et al. |
| 6,523,959 B2 | 2/2003 | Lee et al. |
| 6,535,533 B2 | 3/2003 | Lorenzen et al. |
| 6,558,829 B1 | 5/2003 | Faris et al. |
| 6,638,063 B2 | 10/2003 | Otsuka |
| 6,676,306 B2 | 1/2004 | Ikeda et al. |
| 6,683,421 B1 | 1/2004 | Kennedy et al. |
| 6,692,250 B1 | 2/2004 | Decaudin et al. |
| 6,692,251 B1 | 2/2004 | Logan et al. |
| 6,692,252 B2 | 2/2004 | Scott |
| 6,695,614 B2 | 2/2004 | Plank |
| 6,702,576 B2 | 3/2004 | Fischer et al. |
| 6,709,128 B2 | 3/2004 | Gordon et al. |
| 6,719,558 B2 | 4/2004 | Cao |
| 6,719,559 B2 | 4/2004 | Cao |
| 6,737,681 B2 | 5/2004 | Koda |
| 6,755,647 B2 | 6/2004 | Melikechi et al. |
| 6,755,648 B2 | 6/2004 | Cao |
| 6,755,649 B2 | 6/2004 | Cao |
| 6,780,010 B2 | 8/2004 | Cao |
| 6,783,362 B2 | 8/2004 | Cao |
| 6,799,967 B2 | 10/2004 | Cao |
| 6,824,294 B2 | 11/2004 | Cao |
| 6,827,468 B2 | 12/2004 | Galli |
| 6,876,681 B2 | 4/2005 | Nagamatsu |
| 6,910,886 B2 | 6/2005 | Cao |
| 6,918,762 B2 | 7/2005 | Gill et al. |
| 6,926,524 B2 | 8/2005 | Cao |
| 6,929,472 B2 | 8/2005 | Cao |
| 6,932,599 B1 | 8/2005 | Hartung |
| 6,932,600 B2 | 8/2005 | Cao |
| 6,953,340 B2 | 10/2005 | Cao |
| 6,955,537 B2 | 10/2005 | Cao |
| 6,969,180 B2 | 11/2005 | Waters |
| 6,969,253 B2 | 11/2005 | Cao |
| 6,971,875 B2 | 12/2005 | Cao |
| 6,971,876 B2 | 12/2005 | Cao |
| 6,974,319 B2 | 12/2005 | Cao |
| 6,979,193 B2 | 12/2005 | Cao |
| 6,979,194 B2 | 12/2005 | Cao |
| 6,981,867 B2 | 1/2006 | Cao |
| 6,986,782 B2 | 1/2006 | Chen et al. |
| 6,988,890 B2 | 1/2006 | Cao |
| 6,988,891 B2 | 1/2006 | Cao |
| 6,991,356 B2 | 1/2006 | Tsimerman et al. |
| 6,991,456 B2 | 1/2006 | Plank |
| 6,994,546 B2 | 2/2006 | Fischer et al. |
| 7,001,057 B2 | 2/2006 | Plank et al. |
| 7,033,381 B1 | 4/2006 | Larsen |
| 7,066,733 B2 | 6/2006 | Logan et al. |
| 7,135,034 B2 | 11/2006 | Friedman et al. |
| 2001/0046652 A1 | 11/2001 | Ostler et al. |
| 2002/0014864 A1 | 2/2002 | Gemunder et al. |
| 2002/0048295 A1 | 4/2002 | Kato et al. |
| 2002/0051367 A1 | 5/2002 | Hooker et al. |
| 2002/0054615 A1 | 5/2002 | Nagamatsu et al. |
| 2002/0115037 A1 | 8/2002 | Cao |
| 2002/0133970 A1 | 9/2002 | Gordon et al. |
| 2002/0151941 A1 | 10/2002 | Okawa et al. |
| 2002/0172914 A1 | 11/2002 | Cao |
| 2002/0172918 A1 | 11/2002 | Burtscher et al. |
| 2002/0177096 A1 | 11/2002 | Cao |
| 2002/0181947 A1 | 12/2002 | Cao |
| 2002/0187454 A1 | 12/2002 | Melikechi et al. |
| 2003/0000213 A1 | 1/2003 | Christensen et al. |
| 2003/0015667 A1 | 1/2003 | MacDougald et al. |
| 2003/0036031 A1 | 2/2003 | Lieb et al. |
| 2003/0218880 A1 | 11/2003 | Brukilacchio |
| 2003/0219693 A1 | 11/2003 | Cao |
| 2004/0005524 A1 | 1/2004 | Oxman et al. |
| 2004/0026706 A1 | 2/2004 | Bogner et al. |
| 2004/0029069 A1 | 2/2004 | Gill et al. |
| 2004/0032728 A1 | 2/2004 | Galli |
| 2004/0043351 A1 | 3/2004 | Logan et al. |
| 2004/0070990 A1 | 4/2004 | Szypszak |
| 2004/0090794 A1 | 5/2004 | Ollett et al. |
| 2004/0185413 A1 | 9/2004 | Gill et al. |
| 2005/0003322 A1 | 1/2005 | Logan et al. |
| 2005/0077865 A1 | 4/2005 | Durbin et al. |
| 2005/0082989 A1 | 4/2005 | Jones et al. |
| 2005/0093506 A1 | 5/2005 | Hamada et al. |
| 2005/0096661 A1 | 5/2005 | Farrow et al. |
| 2005/0099824 A1 | 5/2005 | Dowling et al. |
| 2005/0116176 A1 | 6/2005 | Aguirre et al. |
| 2005/0142514 A1 | 6/2005 | Scott |
| 2005/0158687 A1 | 7/2005 | Dahm |
| 2005/0171408 A1 | 8/2005 | Parker |
| 2005/0196721 A1 | 9/2005 | Jackson, III et al. |
| 2005/0231983 A1 | 10/2005 | Dahm |
| 2005/0236586 A1 | 10/2005 | Hartung |
| 2005/0244993 A1 | 11/2005 | Bogner et al. |
| 2006/0024638 A1 | 2/2006 | Rosenblood et al. |
| 2006/0102917 A1 | 5/2006 | Oyama et al. |
| 2006/0188836 A1 | 8/2006 | Logan et al. |
| 2007/0123957 A1 | 5/2007 | Friedman et al. |

FOREIGN PATENT DOCUMENTS

| | | |
|---|---|---|
| DE | 295 11 927 | 2/1997 |
| DE | 100 10 638 | 9/2001 |
| DE | 42 11 233 | 11/2002 |
| EP | 0 116 405 | 8/1984 |
| EP | 0 266 038 | 5/1988 |
| EP | 0 320 080 | 6/1989 |
| EP | 0 672 435 | 9/1995 |
| EP | 0 678 282 | 10/1995 |
| EP | 0 709 698 | 5/1996 |
| EP | 0 736 307 | 10/1996 |
| EP | 0 755 662 | 1/1997 |
| EP | 0 780 101 | 6/1997 |
| EP | 0 780 103 | 6/1997 |
| EP | 0 830 850 | 3/1998 |
| EP | 0 830 851 | 3/1998 |
| EP | 0 830 852 | 3/1998 |
| EP | 0 879 582 | 11/1998 |
| EP | 0 880 945 | 12/1998 |
| EP | 0 884 025 | 12/1998 |
| EP | 0 568 666 | 2/1999 |
| EP | 0 998 880 | 5/2000 |
| EP | 1 031 326 | 8/2000 |
| EP | 1 090 607 | 4/2001 |
| EP | 1 090 608 | 4/2001 |
| EP | 1 093 765 | 4/2001 |
| EP | 1 103 232 | 5/2001 |
| EP | 1 112 724 | 7/2001 |
| EP | 1 138 276 | 10/2001 |
| EP | 1 138 349 | 10/2001 |
| EP | 1 206 923 | 5/2002 |
| EP | 1 228 738 | 8/2002 |
| EP | 1 253 547 | 10/2002 |
| EP | 0 959 803 | 5/2003 |
| EP | 1 309 048 | 5/2003 |
| EP | 0 885 025 | 11/2003 |
| EP | 1 374 979 | 1/2004 |
| EP | 1 388 326 | 2/2004 |
| EP | 1 060 308 | 7/2004 |
| GB | 2 212 010 | 7/1989 |
| GB | 2 218 636 | 11/1989 |
| GB | 2 329 756 | 3/1999 |
| GB | 2 385 137 | 8/2003 |
| GB | 2 385 429 | 8/2003 |

| | | |
|---|---|---|
| JP | 58-33859 | 2/1983 |
| JP | 4-66957 | 10/1992 |
| JP | 5-142607 | 6/1993 |
| JP | 6-285508 | 10/1994 |
| JP | 7-163863 | 6/1995 |
| JP | 8-141001 | 6/1996 |
| JP | 8-194786 | 7/1996 |
| JP | 10-33573 | 2/1998 |
| JP | 2002-111116 | 4/2004 |
| WO | 83/ 01311 | 4/1983 |
| WO | 84/04463 | 11/1984 |
| WO | 92/02275 | 2/1992 |
| WO | 93/09847 | 5/1993 |
| WO | 93/21842 | 11/1993 |
| WO | 95/07731 | 3/1995 |
| WO | 95/19810 | 7/1995 |
| WO | 95/26217 | 10/1995 |
| WO | 97/36552 | 10/1997 |
| WO | 97/37722 | 10/1997 |
| WO | 97/46279 | 12/1997 |
| WO | 97/46280 | 12/1997 |
| WO | 98/03131 | 1/1998 |
| WO | 98/04317 | 2/1998 |
| WO | 99/09071 | 2/1999 |
| WO | 99/11324 | 3/1999 |
| WO | 99/16136 | 4/1999 |
| WO | 99/20346 | 4/1999 |
| WO | 99/35995 | 7/1999 |
| WO | 00/01464 | 1/2000 |
| WO | 00/02491 | 1/2000 |
| WO | 00/13608 | 3/2000 |
| WO | 00/15296 | 3/2000 |
| WO | 00/41726 | 7/2000 |
| WO | 00/41767 | 7/2000 |
| WO | 00/41768 | 7/2000 |
| WO | 00/43067 | 7/2000 |
| WO | 00/43068 | 7/2000 |
| WO | 00/43069 | 7/2000 |
| WO | 00/45733 | 8/2000 |
| WO | 00/67048 | 11/2000 |
| WO | 00/67660 | 11/2000 |
| WO | 01/01118 | 1/2001 |
| WO | 01/03770 | 1/2001 |
| WO | 01/14012 | 3/2001 |
| WO | 01/19280 | 3/2001 |
| WO | 01/24724 | 4/2001 |
| WO | 07/60280 | 8/2001 |
| WO | 0154770 | 8/2001 |
| WO | 001/64129 | 9/2001 |
| WO | 01/65613 | 9/2001 |
| WO | 01/68035 | 9/2001 |
| WO | 01/69691 | 9/2001 |
| WO | 02/06723 | 1/2002 |
| WO | 02/09610 | 2/2002 |
| WO | 02/11640 | 2/2002 |
| WO | 02/13231 | 2/2002 |
| WO | 02/32505 | 4/2002 |
| WO | 02/33312 | 4/2002 |
| WO | 02/49721 | 6/2002 |
| WO | 02/051327 | 7/2002 |
| WO | 02/056787 | 7/2002 |
| WO | 02/060723 | 8/2002 |
| WO | 02/069839 | 9/2002 |
| WO | 02/080808 | 10/2002 |
| WO | 02/097501 | 12/2002 |
| WO | 03/096387 | 11/2003 |
| WO | 03/096925 | 11/2003 |
| WO | 03/107440 | 12/2003 |
| WO | WO 2006/001928 | 1/2006 |
| WO | 2006/014363 | 2/2006 |

OTHER PUBLICATIONS

Davidson-Kaban, Saliha S. et al., "The Effect of Curing Light Variations on Bulk Curing and Wall-to-Wall Quality of Two Types and Various Shades of Resin Composites," Dent. Mater. 13, 344-352, Nov. 27, 2003.
Design and Performance of the Cyrogenic Flexible Diode Heat Pipe (CRYOFD) Flight Experiment http://www.stormingmedia.us/cgi—bin/73/7363/A736373.php Oct. 1998.
European Search Report for EP 1 388 326 A3, Feb. 27, 2004.
Feilzer, A.J. et al., "Influence of Light Intensity on Polymerization Shrinkage and integrity of Restoration-cavity Interface," Eur. J. Oral Science, 103, 322-326, 1995.
Gage, S.,D. Evans et al., 1981 Optoelectronics/Fiber-Optics Application Manual, 2nd Edition pp. 9-12.
Kanca, III, John et al., "Pulse Activation:Reducing Resin-Based Composite Contraction Stresses at the Enamel Cavosurface Magins," Am. J. of Density, 12(3), 107-112, 1999.
Kato, Hiromasa, "Relationship Between the Velocity of Polymerization and Adaption to Dentin Cavity Wall of Light-Cured Composite," Dental Materials J. 6(1), 32-37, 1987.
Koran, Peter et al., "Effect of Sequential versus Continous Irrdiation of a Light-Cured resin Composite on Shrinkage, Viscosity, Adhesion, and Degree of Polymerication," Am. J. of Dentistry, 11, No. 1, 17-22, 1998.
LumiLeds Lighting LLC, "LED Application Note Dntal Lighting Curing, " LemiLeds Lighting Publication No. xxx (03.01) Copyright 2000.
LumiLeds Lighting LLC, "Application Brief AB20-5, replaces AN1149-5, Secondary Optics Considerations for Super Flux LEDs," Copyright 2002 LumiLeds Lighting, Publication No. AB20-5.
LumiLeds Lighting LLC, "Application Note 1149-5, Secondary Optics Design Considerations for Super Flux LEDs," Copyright 2000
LumiLeds Lightsin, Obsoletes Publication No. 5968-121E, Publication No. AN06 (Mar. 2000).
LumiLeds Lighting LLC, "Concept Evaluation Data Luxeon Star 5-Watt, Luxeon 5-Watt Preliminary Target Data Sheet," Publication No. JP10 (Jan. 2002).
LumiLeds Lighting LLC, "Luxeon Power Light Sources of the Future," Jan. 2001- Mike Holt.
Luxeon Dental technical Data, Power Light Source, Apr. 2002.
Mayes, Joe H., "Curing Lights, An Overview," Ormco, vol. 9, No. 2, 2002, pp. 15-17.
Mehl, A. et al., "Physical Properties and Gap Formation of Light-Cured Composites With and Without 'Softstart-Polymerization At of Density," 25, 321-330, 1997.
Petroski, James, IPACK2003-35055: Understanding Longitudinal Fin Heat Sink Orientation Sinsitiviity for Light Emiting Diode (LED) Lighting Applications, Jun. 9, 2003, at http://www.asmeconferences.org/interpack03/viewasseptedabstract.cfm?notoolbar=true&paperid=72&conferencepersonid=125.
Sakaguchi, Ronald L et al., "Reducing Light Energy Density Decreases Post-Gel Contraction While Maintaining Degree of Conversion in Composites," J. of Density, 26, 695-700, 1998.
Schlager, Kenneth J., et al., "An LED-Array Light Source for Medical Therapy," SPIE wol. 1892, Medical Lasers and Systems II, pp. 26-35, 1993.
Swift Jr., Edward et al., "Contemporary Photocuring Issues, Part II," J. Esthetic Denistry, 12(1), 50-57 2000.
Tarle, Z., et al., "the Effect of the Photopolymerization Method on the Quality of Composite Ressin Samples," J. or Oral rehab, 25, 436-442, 1998.
Tir Technologies, Inc., "Miniaturised TIR Lenses For Light Emitting Diodes," TIR Technologies, Inc, Copyright 1997 pp. 1-17.
Wang, Yaxiong et al., IPACK2003-35034: Flat Micro Heat Pipe Cooling Devices for Movable/Laptop Computers, Jun. 9, 2003, http://www.asmeconferences.org/interpaclO3/viewasseptedabstract.cfm?notoolbartrue&paperid51&conferencepersonid**104.

* cited by examiner

HIGH POWER LED ELECTRO-OPTIC ASSEMBLY

CROSS-REFERENCE TO RELATED APPLICATIONS

This application is the National Stage of International Application No. PCT/US2005/016900, filed May 13, 2005, which claims the benefit of U.S. Provisional Application No. 60/579,824 filed Jun. 15, 2004, the contents of which are incorporated by reference herein

FIELD OF INVENTION

The present invention relates to light emitting diode ("LED") technology, particularly to improvements in LED assemblies to provide a desired optical output for various lighting applications.

BACKGROUND OF THE INVENTION

LED assemblies are well-known and commercially available. Such assemblies are employed in a wide variety of applications, typically for the production of ultraviolet radiation, used, for example, in effecting the curing of photo initiated adhesives and coative compositions.

Several factors play into the fabrication of LED assemblies. One is the control of high current supplied to the LEDs to provide a stable and reliable UV source. Another is the position of the lens to hold the output optic in place. Also, a means to provide a path for electrical conduction is required to supply control for the LED. As the current increases to the LED, the need for a high current, high reliability electrical contact becomes necessary. Additionally, a reflector forming the rays coming from the LED is often required. Furthermore, a cooling system is required to carry the heat away from the assembly. Presently, available, LED assemblies may not adequately offer all of these requirements.

Currently, manufacturers are providing a wide range of LED packages in a variety of forms. These packages range from conventional LED lamps to LEDs that use emitter chips of various sizes. While, many of the known LED assemblies produce a high light output, they produce a very disperse wide angle beam that is difficult to capture for efficient collimiation and beam imaging in practical application, such as in a flashlight. As a result, a great deal of the output energy is lost as leakage out from the side of the LED package.

Additionally, light emitted from the LED assembly is ordinarily not evenly distributed. The shape of the light-emitting chip is projected on the target as a high intensity area. Reflections from the electrodes and walls from unpredictable patterns of light are superimposed on the main beam of light. As a result, undesirable hot spots and shadows appear on the object being illuminated. Accordingly, for any lighting application requiring a substantially even or uniform distribution of light over a predetermined area, a transmitting or partial diffuser must be used to scatter the light emitted from each individual LED assembly so that the hot spots and shadows do not appear on the object being illuminated. But, while a diffuser will eliminate hot spots and shadows, it is important that the "directivity" or geometry of the light beam emitted from an individual LED assembly not be degraded or diminished.

In order to overcome these above-noted disadvantages of known light sources, there is a need to provide an LED curing lamp assembly that has a flexible design, is easy to manufacture and reduces assembly cost.

SUMMARY OF THE INVENTION

In one embodiment of the present invention there is disclosed a LED electro-optic electrical sleeve assembly having a generally cylindrical sleeve coated with an electrical insulator. The assembly is divided into an upper portion and a lower portion, the upper and lower portion separated by an insulating material. At least one LED and a conductive reflector is mounted at the upper portion, where the reflector surrounds the LED. A conductive heat sink is mounted at the lower portion, and is in electrical engagement with the LED. Additionally a conductive bonding pin extends through the conductive reflector and is in conductive engagement therewith. An electrical engagement electrically engages the bonding pin to the LED, where the heat sink and the reflector form an electrically conductive location for supplying power to said LED.

DETAILED DESCRIPTION OF THE INVENTION

Figure 1:
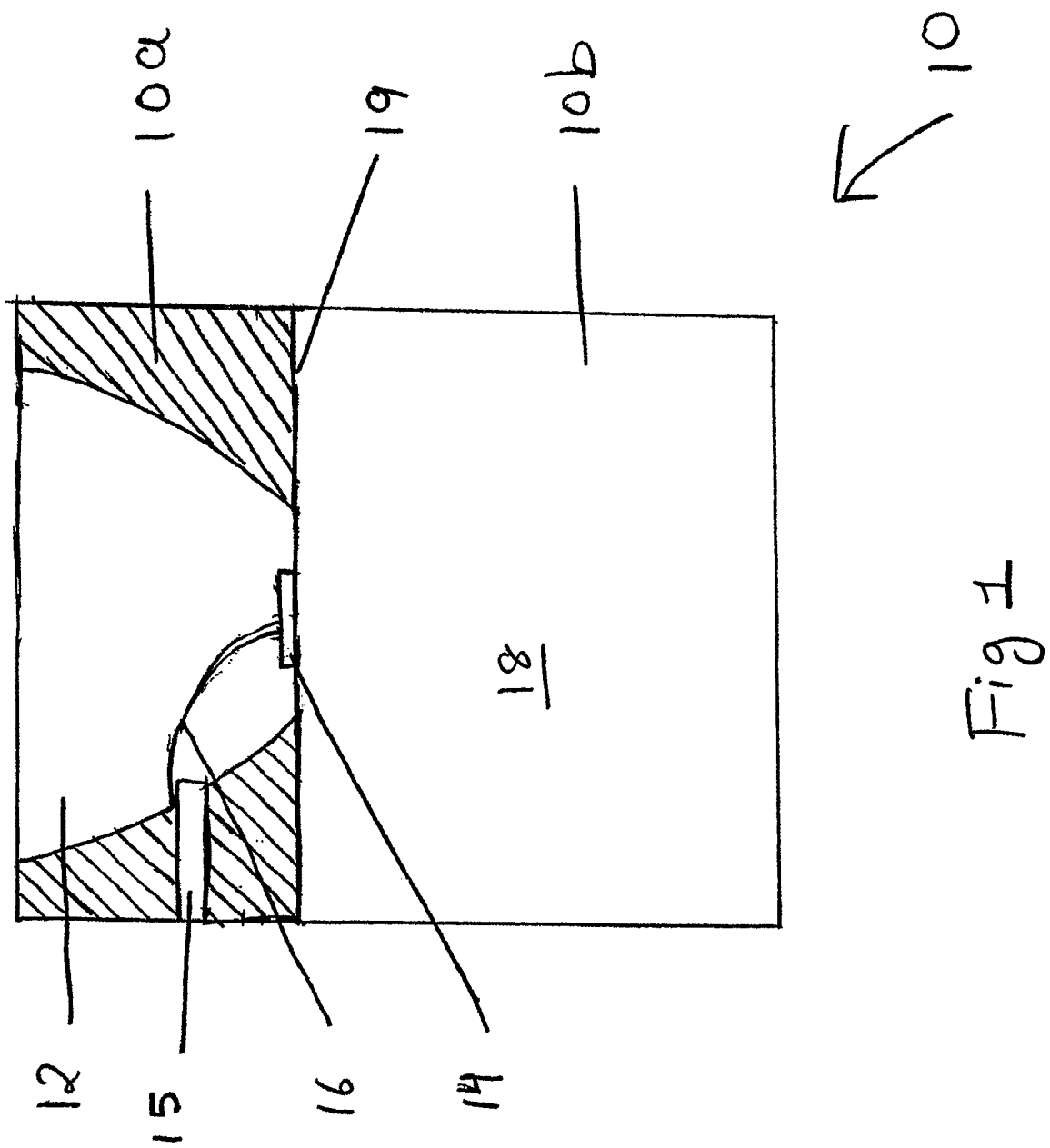
FIG. 1 is a schematic view of a LED ray forming contact assembly of the present invention.

Referring to FIG. 1 of the present invention, there is shown a schematic view of a LED ray forming contact assembly 10. The assembly 10 is a compact means of providing a way to simultaneously contact the LED with electrical contacts and form the rays coming from the LED as will be described hereinbelow. The contact assembly 10 is divided into two contacts, i.e., electrodes, an upper electrode 10a and lower electrode 10b, both made of metal. The upper electrode 10a includes a metal reflector 12 preferably made of aluminum. The metal reflector 12 is press fit into the electrode 10a to form a conductor reflector assembly. The metal reflector 12 may be shaped as a curve and functions to generally collimate and direct the LED light towards the lens and will be described in greater detail below. In a preferred embodiment, the reflector 12 is shaped as an elliptic. A LED chip 14 is mounted in the electrode 10a, desirably positioned at the center and partially or wholly surrounded by the reflector 12. The LED chip 14 is further electrically isolated from the reflector 12. Because metal is a good electrical conductor, both the metal reflector 12 and the metal electrode 10a provide an electrical transfer path away from the LED chip 14. A conductive metal pin 15 desirably coated with gold is pressed into the assembly 10 in the upper electrode 10a as shown in FIG. 1. An electrical engagement such as a gold wire or wires 16 passes from the upper electrode 10a to the lead chip 14. One end of the gold wire 16 is soldered to the metal pin 15 and the other end is welded to the top surface of the LED chip 12 to electrically engage the pin 15 with the LED 14.

When current flows through a chip in an individual LED assembly, both light and heat are generated. Increasing the current through the chip raises the light output but increased current flow also raises the temperature of the chip in the individual LED assembly. This temperature increase lowers the efficiency of the chip. Overheating is the main cause of the failure of individual LED assemblies. To assure safe operation, either the current, and as a result the light output, must be kept at a low level or some other means of transferring heat away from the chip in the individual LED assembly must be provided. Therefore, lower electrode 10b may be defined by with an electrically conducting thermal heat sink 18 which also serves to carry heat away from the LED chip 14. The upper electrode 10a and the lower electrode 10b are held together by an electrically insulating material 19 such as a non-conductive adhesive. The LED 14 is disposed in the assembly 10 in such a manner that the bottom surface is bonded or soldered to the thermal heat sink 18 via the bond material 19. In order to allow the electrical connection through the LED 14, voltage is applied to both upper and lower electrodes 10a and 10b respectively. This causes the heat sink 18 to carry off heat and the curved surface of the reflector 12 forms the light from the LED 14 into a desired pattern. Even though only single LED 14 is shown in FIG. 1, it is understood that multiple LEDs can be employed in the assembly 10.

By providing one of the electrical contacts 10a in conjunction with the reflector and the other electrical contact 10b in conjunction with thermal heat sink, the LED ray forming contact assembly 10 is easy to manufacture, reduces the assembly cost and simplifies the final assembly. Furthermore, the LED ray forming contact assembly 10 also allows the scaling up to multiple LEDs in an assembly without adding significant complexity.

To further exemplify the operation of the entire optical assembly FIGS. 2A-FIG. 2C illustrate an exemplary ray diagrams for a single LED assembly. It will be understood by those skilled in the art that a similar ray diagram results when the LED chip 14 of the single LED assembly is replaced by multiple LED chips 14.

FIGS. 2A-FIG. 2C show a LED optical transform assembly 20 using the LED forming contact assembly 10 of FIG. 1 in conjunction with miniature optical components to form a complete ray forming system. The optical components include a lens 22 that directs the light generated by the LED chip 14 by focusing the light to a desired spot size by collimating the light to a desired location. The lens 22 may be attached or molded precisely in the assembly so that it is centered at the collimated beam. The shape and/or size of the lens 22 may vary to shape the conical beam of light emitted from the LED assemblies to provide the desired optical illumination pattern.

The converging action of the lens 22 depends on both the radius of lens 22 and the positioning of the lens 22 with respect to the individual LED assembly 20. Both the radius and position of the lens 22 may be established during the design process to optimize illumination of the object. The ability to precisely locate and fixture the optic lens 22 is a critical concept in this application. The lens 22 needs to be positioned at right distance from the LED 14 in order to achieve the desired light output.

In FIG. 2A, an optical lens 22a in shape of ball is partially located in the reflector 12 of the upper electrode 10a. Even though a ball shaped optic lens 22a is shown in the present invention, it is understood that other different shapes of optics can be selected. The optics can be varied depending on the desired output. In the present invention, ball optic 22a is selected in order to produce the maximum light power density with the available LED output. The LED output is focused to a desired spot just outside the ball optic lens 22a. If a collimated beam is desired, a half ball optical lens 22b as shown in FIG. 2B or a parabolic optical lens 22c shown in FIG. 2C may desirably be used. The parabolic optical lens 22b of FIG. 2B is positioned in such a manner that part of the lens lies in the reflector 12 and the other part is outside the assembly 20. This positioning of lens 22b emits a wide light pattern as shown in FIG. 2B thereby illuminating a much bigger area on a work piece. Whereas, the parabolic optical lens 22c, as shown in FIG. 2C, is positioned completely outside the reflector 12 and/or the assembly 20. This positioning of lens 22c in FIG. 2C emits a narrower light pattern than the area in FIG. 2B thereby illuminating a specific area on a work piece. This method provides a rigid assembly that can be manufactured precisely and rapidly. The LED ray forming contact assembly size, other optics lenses 22 can preferably be modified and further distances and positions between the LED 14 and the lens 22 can be varied to accommodate a wide range of optical components while minimizing the cost and complexity of the complete assembly.

The number of LED assemblies employed determines the size of a LED array and the desired output intensity. An end user can easily increase or decrease the output intensity by adding/removing LED assemblies to/from the LED array. Also, a user can change the operating wavelength of the assembly by replacing one or more LED assemblies of a first operating wavelength with one or more replacement assemblies having a second wavelength. In addition, a user can replace damaged or expired LED assemblies without replacing the entire LED array.

Figure 2:
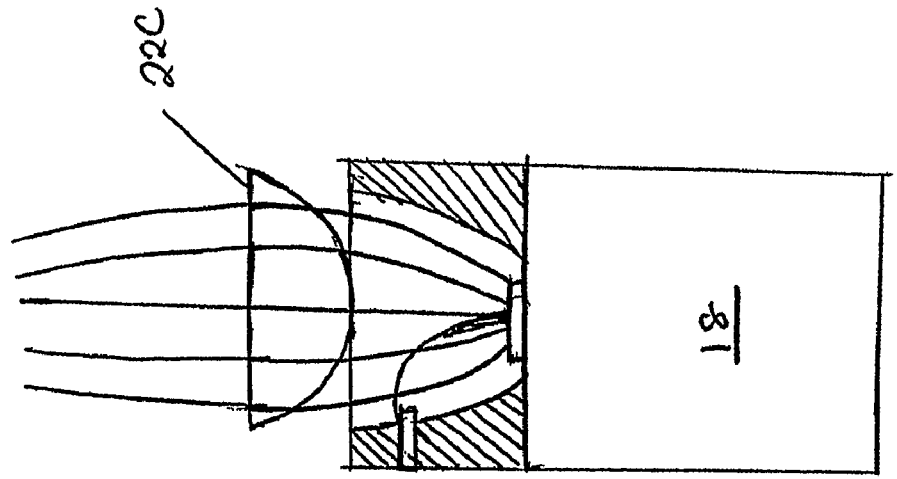
FIG. 2 is a schematic view of a LED optical transform assembly using the ray forming contact assembly of FIG. 1.
Figure 2:
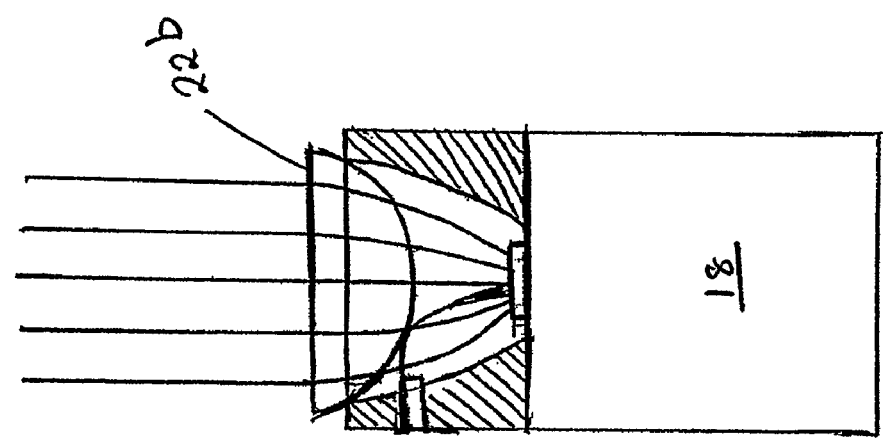
Figure 2:
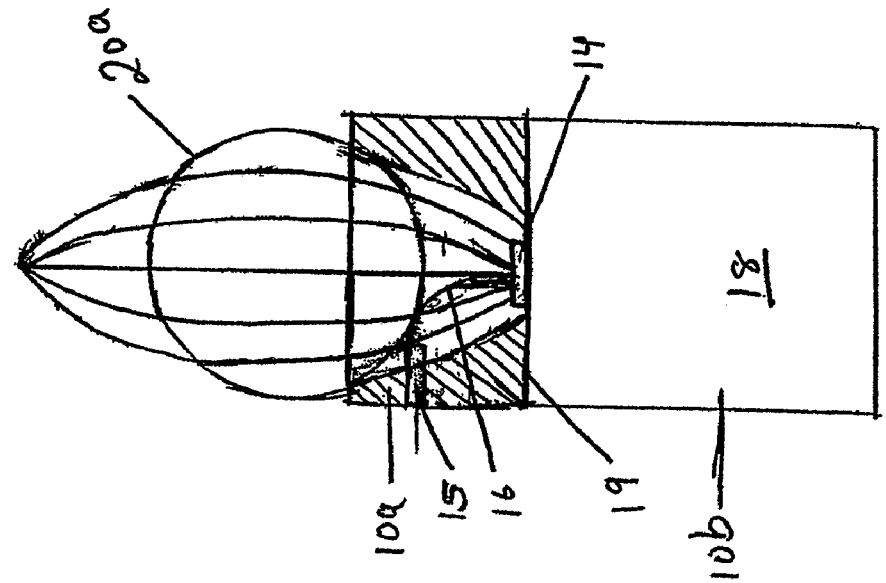

Regarding the optical properties of the optical assembly 10 and 20, each, LED 14, emits diffuse light at a predetermined optical power and a predetermined optical wavelength. Exemplary LEDs 14 according to the present invention emit preferably greater than 500 mw of optical power at desirably 405 nm. The reflective cavity collimates a majority of the diffuse light emitted by the LED 14 when the LED 14 is placed at the desired location within the reflective cavity. The parabolic reflector 12 represents an exemplary reflective cavity that collimates the majority of the light when the LED 14 is placed at or near the focal point of elliptic reflector 12, as shown in FIG. 2. It will be understood by those skilled in the art that the collimating means of the present invention is not limited to an elliptical reflector 14. Other LED collimating means well understood by those skilled in the art may also be implemented in the present invention.

Figure 3:
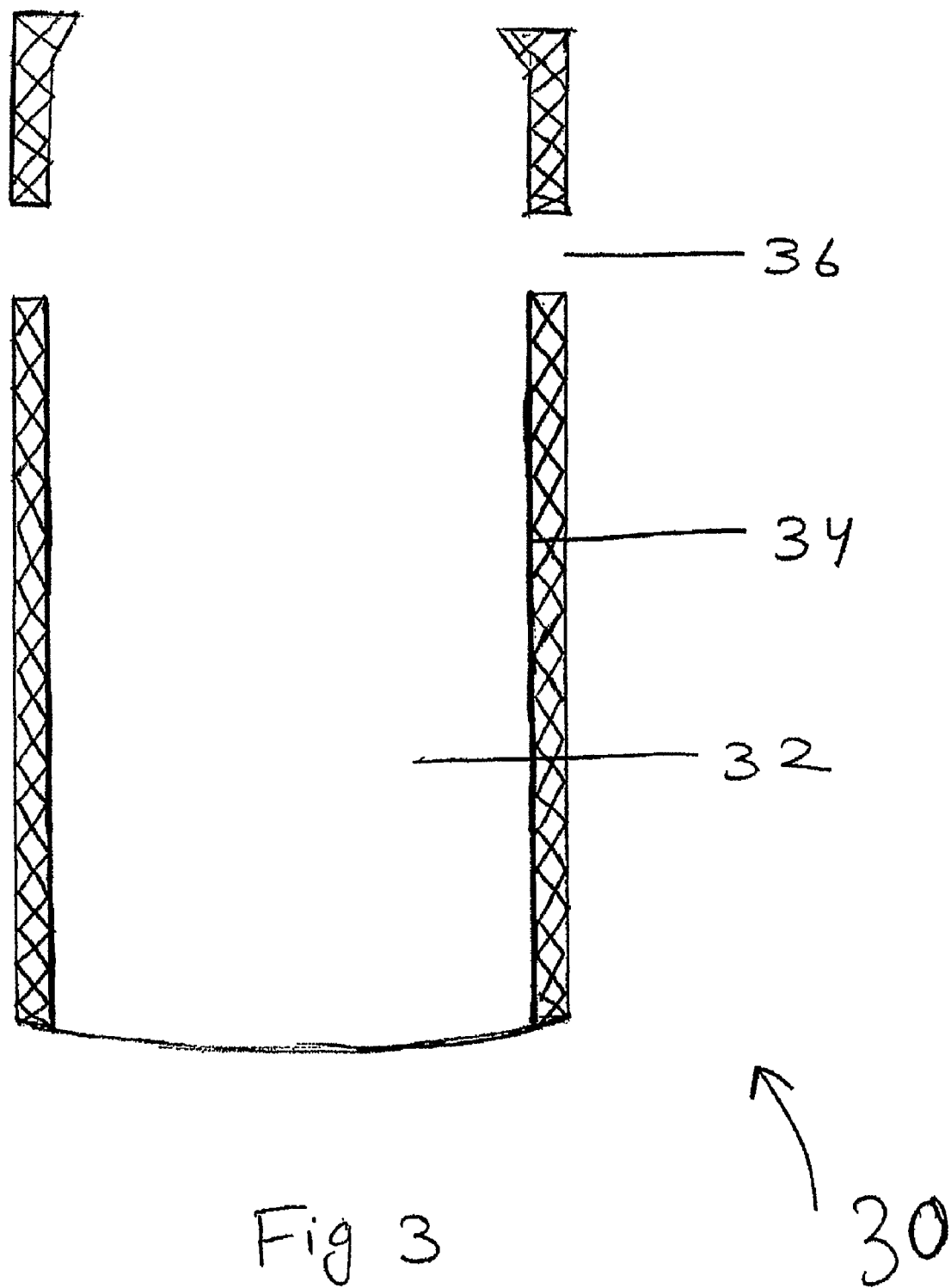
FIG. 3 is a schematic view of an electrical sleeve assembly of the present invention.

In order to make small optical assemblies, preferably such as LED optical assemblies, it is necessary to have a means to hold the output optic in place and also provide a path for electrical conduction. One such means is an electrical sleeve assembly 30 shown in FIG. 3. The assembly 30 is preferably conducted of aluminum alloy including a generally cylindrical sleeve 32 preferably made of aluminum coated with an electrical insulating coating 34 such as a non-conductive adhesive. The outside of the sleeve 32 is masked to allow contact with an external electrical connection as will be described in greater detail below. The assembly 30 shows a cutaway drawing with slots 36 at upper ends as shown in FIG. 3. These slots 36 are preferably machined into the sleeve after the sleeve 32 has been coated. Since the slots 36 now allow bare metal assembly 30 to be exposed over a large area, the total exposed surface provides a very low resistance contact when the conductive coating such as an adhesive is applied between the sleeve slots 36 and the metal contact inside the sleeve 36. The conductive adhesive connects the reflector 12 inside the assembly to the outside sleeve 32. Alternatively, a wire bonding may be applied to bond the reflector 12 to the sleeve 32. The two slots 36 provide four open surfaces to make contact with the sleeve 32. Furthermore, the electrical conductivity is maximized due to the length of the slots 36 and due to the fact that two surfaces for each of the two slots 36 provide a maximum surface area in a compact assembly. The shape of upper ends of the sleeve 32 are preferably modified to retain an optic that is being used with assembly 30. By simply placing an optic in the sleeve 32 and sliding onto preferably a LED assembly, then applying the conductive adhesive to the slots 36 or wire bonding the reflector 12 to the sleeve 32, an electro-optic assembly is electrically connected, as will be described in greater detail below with reference to FIG. 4.

Figure 4:
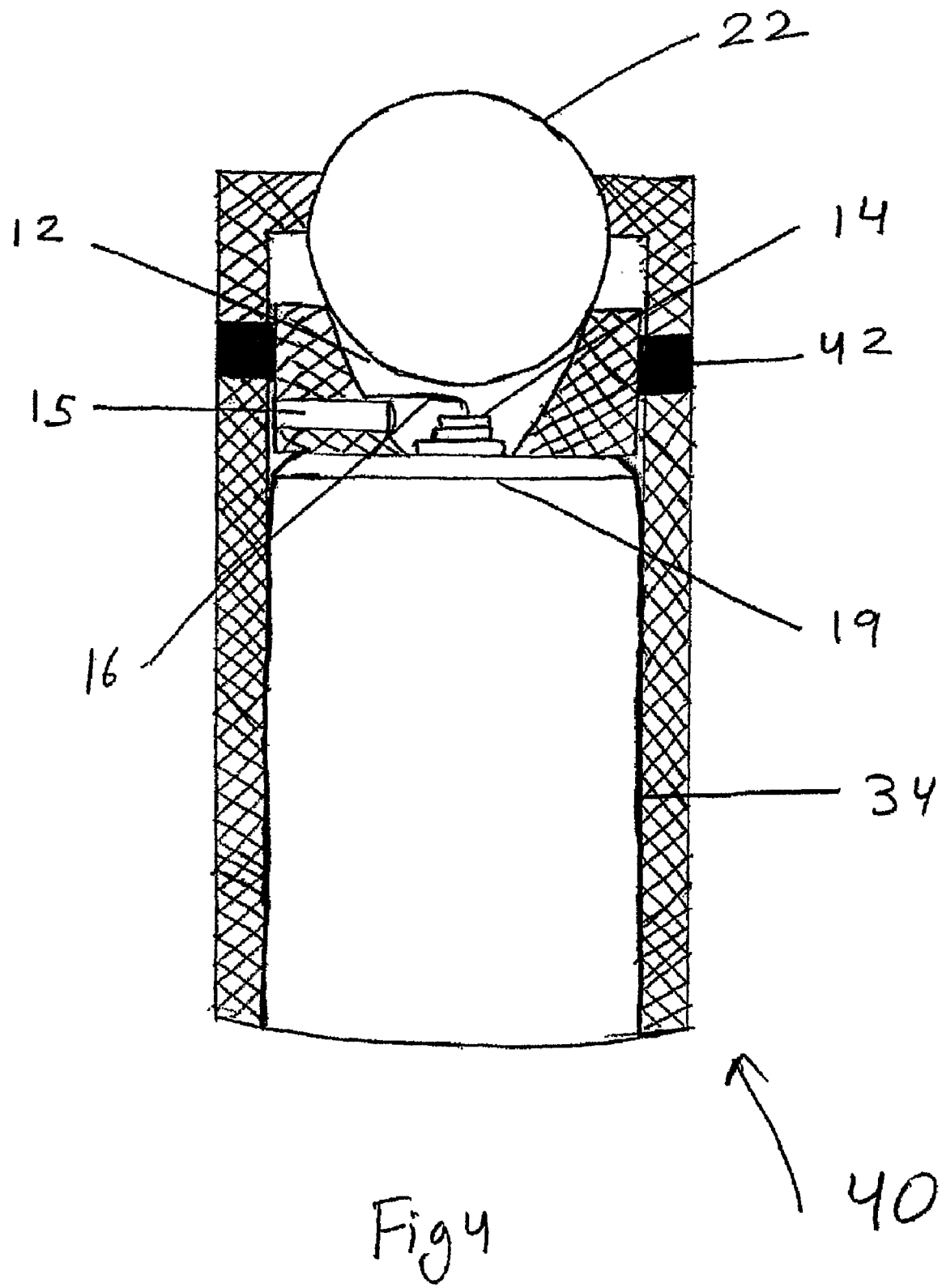
FIG. 4 is a schematic view of a LED, Electro-optic Assembly of the present invention.

The LED 14 is combined with the ray forming contact assembly 10, LED variable optical assembly 20 and the LED lens retaining electrical sleeve assembly 30 to form a complete LED electro-optic assembly 40 as shown in FIG. 4. LED 14 is bonded or soldered to the thermal heat sink 18 made of an electrically conductive material. Once the LED 14 is contacted to the thermal heat sink 18 with the insulating material 19, the ray forming contact assembly 10 is bonded in place. Again, the top surface of the LED 14 is bonded to the conductive metal pin 15 via the gold wire 16. The pin 15 is preferably coated with gold and is pressed into the metal contact assembly. Because the contact assembly metal is selected for reflectivity and electrical conductivity, it will direct the LED output and serve to electrically connect the top surface of the LED 14 to the outside surface of the ray forming contact assembly 10. Next, the LED variable optical assembly 20 is installed preferably with a ball optic lens 22a.

Finally, the LED lens retaining electrical sleeve assembly 30 is installed while applying the structural adhesive 34 on the thermal heat sink 18. The reflector 12 is preferably bonded to the thermal heat sink 18 with the structural adhesive 34. So, the structural adhesive 34 functions to hold the assembly securely together, providing some thermal conduction and additional electrical insulation from the thermal heat sink 18. Additionally, a conductive adhesive 36 is preferably applied to the slots 36 to bond the outside sleeve 32 to the reflector 12. Alternatively, as discussed above, a wire, preferably aluminum (not shown) may be used to wire bond between the reflector 12 inside the assembly and the outside sleeve 32 preferably made of aluminum. Preferably, multiple wire bonds are used to bond the reflector 12 and a recess (not shown) below the surface of the outside sleeve 32. Also, the recess is desirably coated for protection. The conductive material is heat cured and the complete LED electro-optic assembly 40 is formed. Again, the assembly 40 shows only a single LED 14, multiple LED devices may preferably be bonded to the assembly.

Individual alignment of the LED 14 or multiple LEDs is required because no two individual LED assemblies are exactly the same. Differences arise from the positioning of the chip 14 inside the reflector 12, the positioning of the reflector cup 12, the positioning of the electrodes 10a and 10b, and the positioning of the optic lens 22. All of these factors affect the geometry and direction of the beam of light. Due to the manufacturing process of individual LED assemblies, the components in individual LED assemblies exhibit a very wide range of positional relationships. Therefore, for any application that requires illumination of a specific area, each individual LED assembly must be manually aligned and then permanently held in place by some means of mechanical support.

While a single LED is used herein to illustrate the invention, it will be understood by those skilled in the art that the invention described herein applies to a plurality of LEDs or LED array. A plurality of LEDs may be arranged in any manner as desired for illumination.

Even though, in the present invention the LED 14 is shown to be a rectangular frame, those of ordinary skill in the art will understand that according to the disclosed invention, LED illuminators may be formed in any shape suitable to provide light for a wide array of applications, including but not limited to photocuring, video, shop windows, photography or specialty product displays. Because of the durability and rugged construction of the disclosed LED illuminator, it may be used in outdoor settings, marine applications, or hostile environments.

What is claimed:

1. A LED electro-optic assembly comprising:
   at least one LED;
   a conductive heat sink having mounted at one end thereof, said LED in electrical engagement therewith;
   a conductive reflector mounted to said one end of said heat sink and surrounding said LED;
   an insulative member electrically isolating said conductive reflector from said heat sink;
   a conductive bonding pin extending through said conductive reflector and in conductive engagement therewith; and
   an electrical engagement engaging said bonding pin with said LED;
   wherein said heat sink and said reflector form an electrically conductive location for supplying power to said LED.

2. The assembly of claim 1 wherein said heat sink includes a planar surface at said one end and wherein said LED is mounted to said surface.

3. The assembly of claim 2 wherein said reflector is an elliptical reflector having a central opening therethrough and wherein said LED is mounted in said central opening.

4. The assembly of claim 3 wherein said insulative member includes a bonding agent for securing said conductive reflector to said heat sink.

5. The assembly of claim 1 wherein said heat sink is a heat pipe.

6. The assembly of claim 1 wherein said bonding pin is gold plated.

7. The assembly of claim 1 wherein said wire bond is a wire jumper interconnecting said bonding pin to said LED.

8. The assembly of claim 1 further including:
   an optic lens member positioned adjacent to said optical reflector, said optic lens member being spaced from said LED for focusing light rays emanating from said LED.

9. The assembly of claim 7 wherein said optic lens member is supported at least partially within said optic reflector.

10. The assembly of claim 7 wherein said optic lens member is a ball optic for production of enhanced light power density.

11. The assembly of claim 7 wherein said optic lens member is a half ball optic for production of collimate light.

12. The assembly of claim 7 further including a conductive retaining sleeve supporting said heat sink, said reflector and said optic lens member.

13. The assembly of claim 12 wherein said conductive sleeve is placed in electrical continuity with said conductive reflector.

14. The assembly of claim 13 wherein said conductive sleeve is insulatively separated from said heat pipe.

15. The assembly of claim 13 wherein said conductive sleeve is insulatively separated from said heat pipe by an insulative adhesive which secures said sleeve to said heat pipe.

16. The assembly of claim 13 wherein said conductive sleeve is insulatively coated.

17. The assembly of claim 15 wherein said sleeve includes at least one passage therethrough adjacent said conductive reflector.

18. The assembly of claim 17 wherein said passage is filled with a conductive adhesive to establish conductive engagement between said sleeve and said reflector.

19. The assembly of claim 17 which said passage is electrically engaged with said sleeve and said reflector.

20. A LED electro-optic electrical sleeve assembly comprising:
- a generally cylindrical sleeve coated with an electrical insulator, having an upper portion and a lower portion, said upper and lower portion separated by an insulative member;
- at least one LED and a conductive reflector having mounted at said upper portion, wherein said reflector surrounds said LED;
- a conductive heat sink having mounted at said lower portion, said LED in electrical engagement therewith;
- a conductive bonding pin extending through said conductive reflector and in conductive engagement therewith; and
- an electrical engagement engaging said bonding pin to said LED;
- wherein said heat sink and said reflector form an electrically conductive location for supplying power to said LED.

21. The assembly of claim 20 further comprising a pair of slots located at an upper portion.

22. The assembly of claim 21 wherein said slots are coated with a conductive adhesive to bond said sleeve to the reflector.

23. The assembly of claim 21 wherein said reflector is bonded to said sleeve via an aluminum wire.

24. The assembly of claim 20 wherein said reflector is bonded to the heat sink by said insulative member.

25. The assembly of claim 20 further comprising an optic lens member positioned adjacent to said reflector, said optic lens member being spaced and positioned from said LED for focusing light rays emanating from said LED.

26. The assembly of claim 25 wherein said upper portion retains said optic lens member.

27. The assembly of claim 25 wherein said optic lens member is supported at least partially within the reflector.

28. The assembly of claim 25 wherein said optic lens member is positioned completely outside said reflector.

* * * * *